United States Patent [19]
Gruber et al.

[11] Patent Number: 5,745,063
[45] Date of Patent: Apr. 28, 1998

[54] ARRANGEMENT FOR THE SUMMATION OF PRODUCTS OF SIGNALS

[75] Inventors: Peter Gruber, Zwillikon; Raul Cermeno, Cham; Heinz Lienhard, Zug, all of Switzerland

[73] Assignee: Landis & Gyr Technology Innovation AG, Zug, Switzerland

[21] Appl. No.: 867,205

[22] Filed: Jun. 2, 1997

Related U.S. Application Data

[63] Continuation of Ser. No. 434,384, May 3, 1995.

[30] Foreign Application Priority Data

May 5, 1994 [CH] Switzerland .................. 1411/94

[51] Int. Cl.⁶ .................................................. H03M 3/00
[52] U.S. Cl. ........................ 341/143; 341/141; 341/159; 341/131
[58] Field of Search .................................. 341/141, 153, 341/159

[56] References Cited

U.S. PATENT DOCUMENTS

| | | | |
|---|---|---|---|
| 5,073,777 | 12/1991 | Fukuhara et al. | 341/131 |
| 5,148,167 | 9/1992 | Ribner | 341/143 |
| 5,208,594 | 5/1993 | Yamazaki | 341/143 |
| 5,363,101 | 11/1994 | Ueki | 341/143 |
| 5,528,240 | 6/1996 | Wilson et al. | 341/143 |

FOREIGN PATENT DOCUMENTS

| | | |
|---|---|---|
| 91-114449 | 9/1989 | Japan . |
| 2 167 619 | 5/1986 | United Kingdom . |

OTHER PUBLICATIONS

*Technisches Messen* 59 (1992), vol. 1, 2, 6 and 7/8, pp. 262 to 268, entitled "Anwordung von Oversampling–Verfahren zur Erhöhung der Aflösung digital erfasster Signale," by M. Barmettler and P. Gruber, R. Oldenbourg publishers.

"A Programmable Mixed–Signal ASIC for Power Metering", *IEEE Journal of Solid State Circuits*, vol. 26, No. 12, Dec., 1991, by L. Garverick, K. Fujino, D. Mcgrath and R. Baertsch, pp. 2008–2015.

*Primary Examiner*—Jeffrey A. Gaffin
*Assistant Examiner*—Jason H. Vick
*Attorney, Agent, or Firm*—Meltzer, Lippe, Goldstein, Wolf & Schlissel, P.C.

[57] ABSTRACT

In a circuit at least one of the signals ($u[t]$ or $i[t]$) is transmitted to a signal input of a sigma-delta modulator operated at a first clock frequency ($1/T_S$) the output of which is connected to at least one of two signal inputs of a multiplication/addition element (3). The arrangement is used for example in electricity counters and makes it possible to calculate sums of products by means of simple shift and algebraic adding operations while maintaining closely the precision achievable with a classic multiplication. The arrangement is especially advantageous if the multiplications are done on a semiconductor chip.

14 Claims, 3 Drawing Sheets

ARRANGEMENT FOR THE SUMMATION OF PRODUCTS OF SIGNALS

This is a continuation of application Ser. No. 08/434,384, filed May 3, 1995, now abandoned.

BACKGROUND OF THE INVENTION

The instant invention relates to a circuit for the summation of the products of two identical or different signals.

Such a circuit is used, e.g., in electricity counters to ascertain effective voltage and/or voltage values, correlations, averaged electrical power and/or energy values. As is known, the latter are equal to a sum of instantaneous power values which in turn are equal to a product of an instantaneous voltage value and of an appertaining instantaneous current value.

A classic multiplication in which two operands of R bits each are multiplied with each other at a slow clock frequency, and which was previously obtained by filtering at a high speed clock frequency with subsequent decimation, is known.

It is the object of the invention to provide a circuit of the type mentioned initially which does not require multiplication of two R-bit operands but only simple shift and algebraic addition operations at a high speed clock frequency while maintaining closely the precision which can be achieved by the classical multiplication, whereby a calculation of an effective value of a current in a dynamic range of 1:1000 for example is possible with a precision of 0.5% without great effort. The arrangement according to the invention is especially advantageous if the inventive multiplication circuit is realized on a special semiconductor chip.

SUMMARY OF THE INVENTION

In accordance with the present invention, a circuit for the summation of products of a first signal (u[t] or i[t]) with a second signal (u[t] or i[t] or f[t]) which may be the same as or different from the first signal, comprises a first sigma-delta modulator operated at a first clock frequency and having at least one input into which is transmitted at least one of the signals. The output of the sigma-delta modulator is connected to at least a first of two signal inputs of a multiplication/addition element.

BRIEF DESCRIPTION OF THE DRAWINGS

Examples of embodiments of the invention are illustrated in the drawings and are described in further detail below. In the drawings.

DETAILED DESCRIPTION OF PREFERRED EMBODIMENTS OF THE INVENTION

In the arrangement according to the invention, a first signal, designated u[t] or i[t], is multiplied by a second identical or different signal u[t] or i[t] or f[t]. In this process,

2 at least one of the signals u[t] or i[t] is transmitted to a signal input of a sigma-delta modulator 1 or 2 operated at a first clock frequency $1/T_S$ the output of which is connected to at least one of two signal inputs of a multiplication/addition element 3. The signal u[t] may be an electrical voltage, for example, while the signal i[t] preferably represents an electrical voltage which is proportional to an electrical current. If the latter is part of voltage u[t], the product of the two signals u[t] and i[t] is proportional to the appertaining momentary power p[t]=u[t]·i[t].

Figure 1:
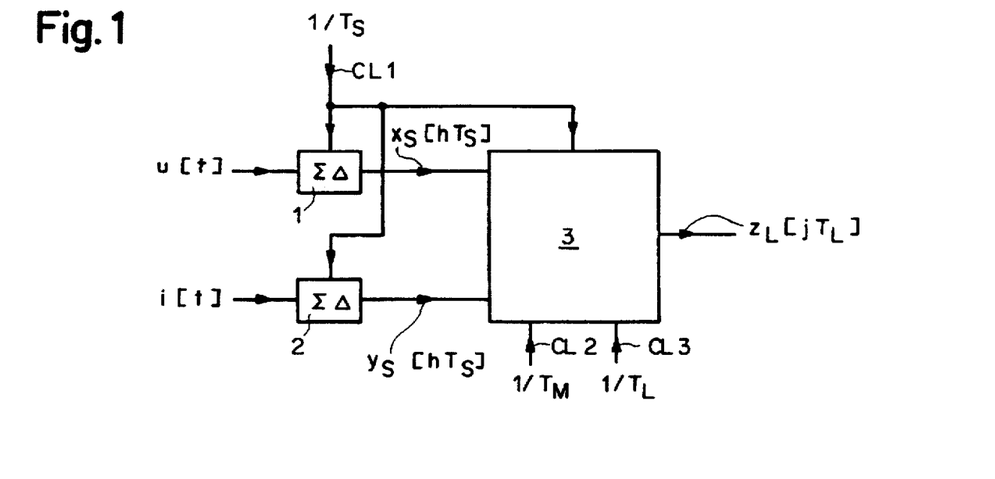
FIG. 1 shows a schematic block diagram of a first variant of a circuit according to the invention.

In a first variant of the arrangement according to the invention as shown in FIG. 1, the two signals u[t] and i[t] are different time-dependent signals, each of which is transmitted to a signal input of an appertaining sigma-delta modulator 1 and 2 operated at the first clock frequency $1/T_S$. The outputs of the two sigma-delta modulators 1 and 2 in this variant are connected to one of the two signal inputs of the multiplication/addition element 3. The time-dependent signal u[t] is thereby transmitted via the sigma-delta modulator 1 to a first of the two signal inputs and the time-dependent signal i[t] is transmitted via the sigma-delta modulator 2 to a second of the two signal inputs of the multiplication/addition element 3.

Figure 2:
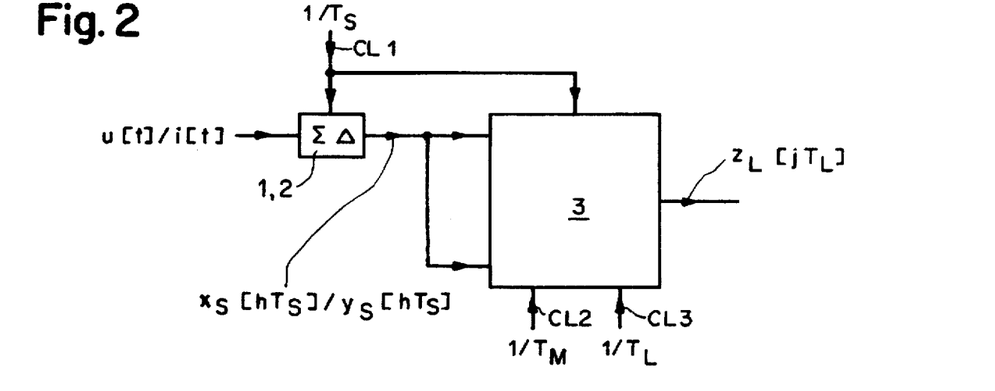
FIG. 2 shows a schematic block diagram of a second variant of the circuit according to the invention.

In the second variant of the arrangement according to the invention as shown in FIG. 2, the two signals are identical time-dependent signals, u[t] and u[t] or i[t] and i[t], only one of which is transmitted to the signal input of the sigma-delta modulator. The output of the latter is connected to the two signal inputs of the multiplication/addition element 3. The two identical time-dependent signals, u[t] and u[t] or i[t] and i[t], are multiplied with each other in the arrangement according to the invention so that the squared product $u^2[t]$ or $i^2[t]$ of the applicable time-dependent signal is produced.

Figure 3:
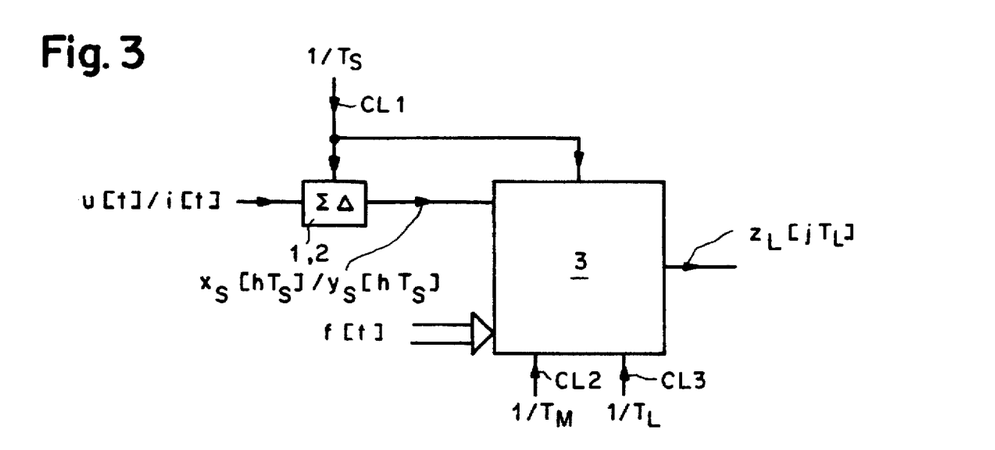
FIG. 3 shows a schematic block diagram of a third variant of the circuit according to the invention.

In the third variant of the arrangement according to the invention shown in FIG. 3, the first signal is a time-dependent signal u[t] or i[t] not known in advance, and the second signal is a time-variable function f[t] which is known in advance. The first signal u[t] or i[t] is transmitted in this variant to the signal input of the appertaining sigma-delta modulator 1,2. The output of the latter is connected to one of the two signal inputs of the multiplication/addition element 3. Single-bit or multi-bit digital values of the known time-variable function f[t] are in turn transmitted to the other signal input of the multiplication/addition element 3. The values of the known time-variable function f[t] are not always available in the form of a 1-bit wide data stream. In such case, multibit digital values are in parallel transmitted via a bus connection to the appropriate signal input of the multiplication/addition element 3 which is designed as a bus input. In FIG. 3 the signal u[t] or i[t] is transmitted via the sigma-delta modulator 1,2 in the form of 1-bit wide data stream to the first signal input of the multiplication/addition element 3, while the multi-bit digital values of the function f[t] are transmitted to the second signal input. In this third variant of the invention, the multiplication/addition may be used to find correlations for example.

The multiplication/addition element 3 is supplied in all variants via separate clock inputs with three clock signals CL1, CL2 and CL3. The sigma-delta modulators 1 and 2 are each supplied with the clock signal CL1, the frequency of which is the first clock frequency $1/T_S$. The time-function signals u[t] and i[t] are sampled in the appertaining sigma-delta modulator 1 or 2 at the first clock frequency $1/T_S$. The frequency of CL2 is the second clock frequency $1/T_M$ and that of CL3 is the third clock frequency $1/T_L$. $T_S < T_M < T_L$, where $T_M = N \cdot T_S$ and $T_L = W \cdot T_M$ applies. The first clock frequency $1/T_S$ is therefore greater than the second clock frequency $1/T_M$ and the latter in turn is greater than the third clock frequency $1/T_L$. The two relations $N=T_M/T_S$ and $W=T_L/T_M$ which are assumed to be integer numbers are designated as over-sampling rates or over-sampling factors ("over-sampling ratio") and therefore represent a first or second over-sampling rate.

Hereinafter $hT_S$, $kT_M$ and $jT_L$ designate the sampling intervals appertaining to the clock frequency $1/T_S$ or $1/T_M$ or $1/T_L$, where h, k and j represent running sampling numbers n=0, 1, 2, 3, . . . , etc. Signals of clock frequency $1/T_S$ shall hereinafter have an index S, signals of clock frequency $1/T_M$ an index M and a signal of clock frequency $1/T_L$ an index L. Accordingly, the output signals of the sigma-delta modulators 1 and 2 are designated by $x_S[hT_S]$ or $y_S[hT_S]$ and the output signal of the multiplication/addition element 3 by $z_L[jT_L]$ (see FIGS. 1 to 3).

The structure and operation of the sigma-delta modulators 1 and 2 are known from the printed publication, *Technisches Messen* 59 (1992), volumes 1, 2, 6 and 7/8, pages 262 to 268, entitled "Anwordung von Oversampling-Verfahren zur Erhöhung der Aflösung digital erfasster Signale," by M. Barmettler and P. Gruber, R. Oldenbourg publishers, hereinafter referred to as Barmettler et al., which is incorporated herein by reference.

Figure 4:
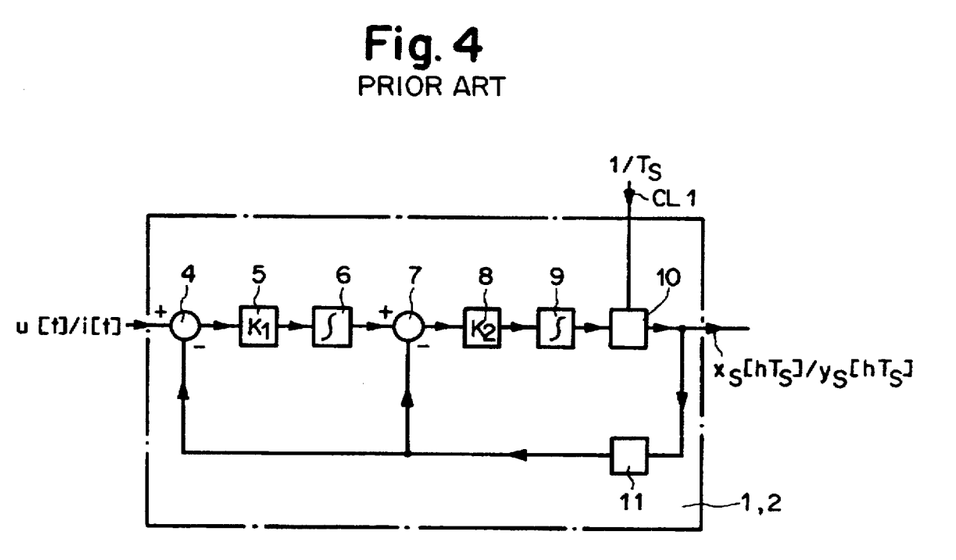
FIG. 4 shows a schematic block diagram of a known sigma-delta modulator of the second order.

Each sigma-delta modulator 1 or 2 of the three variants according to the invention is preferably a sigma-delta modulator of the second order. In FIG. 4 such a known sigma-delta modulator 1 or 2 of the second order is shown, the forward path of which comprises a series connection of a first difference-forming element 4, a first amplification element 5, a first integrator 6, a second difference forming element 7, a second amplification element 8, a second integrator 9 and a 1-bit analog/digital converter 10, whereby the latter is preferably a comparator and is used with the difference-forming elements 4 and 7 for series connection of the plus inputs. The output of the 1-bit analog/digital converter 10 which is at the same time the output of the sigma-delta modulator 1 or 2, is connected via a 1-bit analog/digital converter 11, e.g., a zero order hold (ZOH) to the minus inputs of the two difference-forming elements 4 and 7. A clock input of the 1-bit analog/digital converter 10 is supplied by the clock signal CL1 with the first clock frequency $1/T_S$. In the amplification elements 5 and 8, the input signals are weighted by a factor $K_1$ or $K_2$.

For the output signal $x_s[hT_S]$ of the sigma-delta modulator 1, the following apply:

$$x_S[hT_S]=u_S[hT_S]+\Delta_{Su}[hT_S] \quad (1), \text{with}$$

$$|u_S[hT_S]|<Q/2 \quad (2)$$

For the output signal $y_S[hT_S]$ of the sigma-delta modulator 2, the following apply:

$$y_S[hT_S]=i_S[hT_S]+\Delta_{Si}[hT_S] \quad (1a), \text{with}$$

$$|i_S[hT_S]|<Q/2 \quad (2a)$$

In the above, Q is the magnitude of the quantization level of the 1-bit analog/digital transformer 10. The signals $u_{S[hTS]}$ and $i_S[hT_S]$ with the exception of a delay by one or two cycles are in a first approximation the non-quantized signals $u[t]$ or $i[t]$ sampled at the clock frequency $1/T_S$. The signals $\Delta_{Su}[hT_S]$ and $\Delta_{Si}[hTs]$ are error sequences at the output of the sigma-delta modulator 1 or 2 caused by the quantization of which it is known that each has a differentiating character. Each of the relationships (2) and (2a) indicates the validity range of the input signal $u[t]$ or $i[t]$. If the latter is limited to ±1, this results in Q=2. The time-dependent signals $u[t]$ and $i[t]$ are converted in the sigma-delta modulator 1 or 2 into 1-bit wide stream $x_S[hTs]$ or $y_S[hTs]$ of the clock frequency $1/T_S$ which represents a two-value signal $\{+Q/2, -Q/2\}$ or, e.g., $\{+1, -1\}$ which consists only of the two values $+Q/2$ and $-Q/2$ or $+1$ and $-1$. The output signal $x_S[hT_s]$ or $y_s[hT_s]$ of the sigma-delta modulator 1 or 2 is thereby a sequence of two-value impulses.

Figure 5:
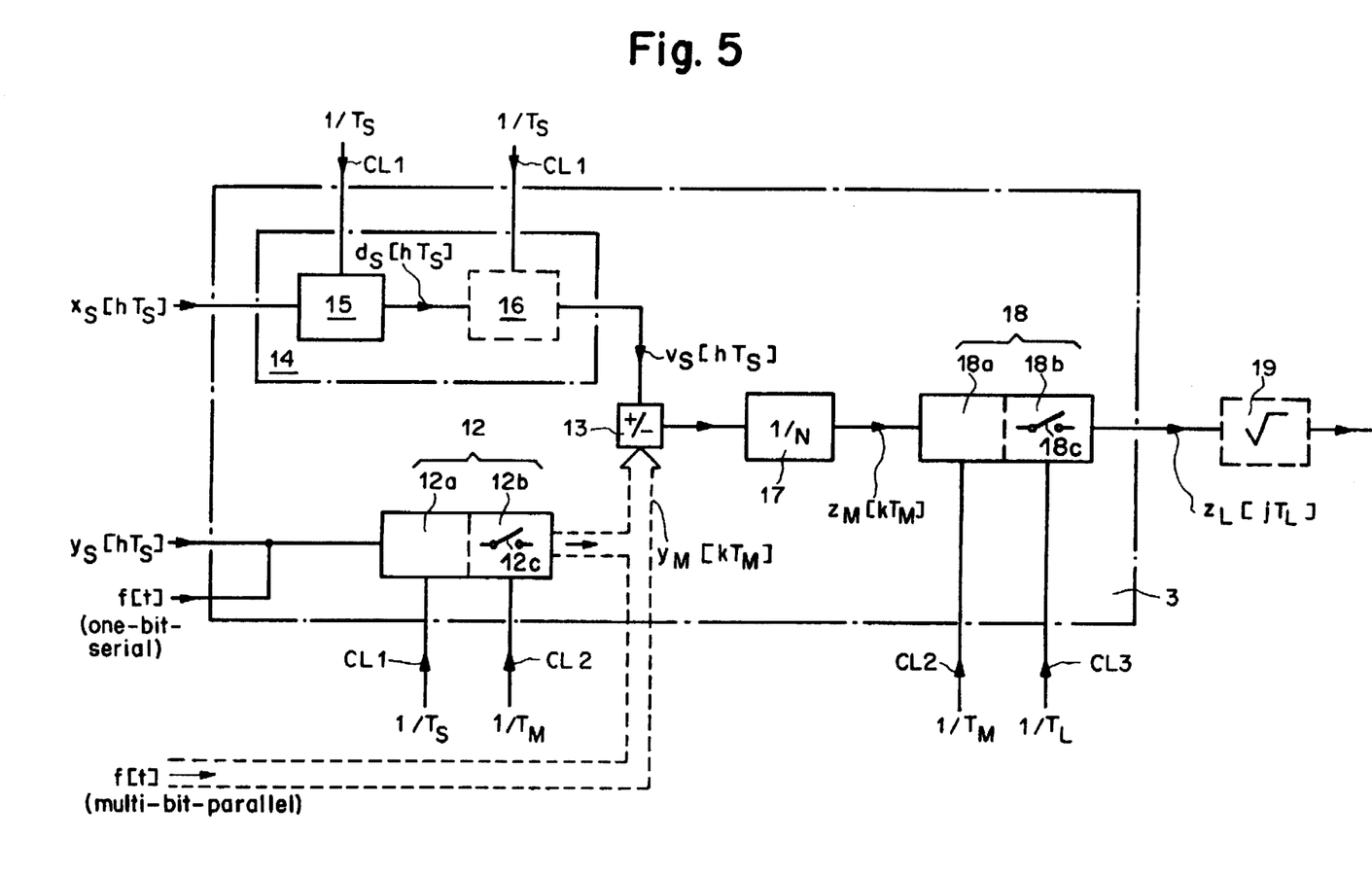
FIG. 5 shows a schematic block diagram of a multiplication/addition element according to the invention.

As FIG. 5 shows, one, e.g., the second signal input within the multiplication/addition element 3, is connected via a first decimation filter 12 operated at the first clock frequency $1/T_S$ to a first input of an adding element 13. The other, e.g., the first signal, is input via a delaying arrangement 14 operated at the first clock frequency $1/T_S$ to a second input of the adding element 13. As the voltage $u[t]$ is multiplied by the appertaining current i [t] in order to find the sum of a corresponding momentary power (see FIG. 1), the signal i [t] which as a rule has a greater dynamic range than the voltage u [t], is preferably transmitted to the second signal input of the multiplication/addition element 3 and thereby to the decimation filter 12, while the voltage $u[t]$ is preferably transmitted to the first signal input, i.e., to the delaying arrangement 14. Precision in this case is better than in finding the effective value of the current i [t] (see FIG. 2), since the large dynamic is present only with one operand, i.e., the current i[t]. In the third variant (see FIG. 3) the signal $u[t]$ or $i[t]$ is preferably transmitted to the first signal input of the multiplication/addition element 3 and thereby to the delaying arrangement 14, while the multi-bit digital values of time dependent function f[t] for example are preferably transmitted to the second signal input and thereby to the first input of the adding element 13.

The adding element 13 serves to make algebraic additions and its output is connected via a dividing element 17 to a signal input of a second decimation filter 18 driven at the second clock frequency $1/T_M$, the output of which constitutes an output of the multiplication/addition element 3. The dividing factor of the dividing element 17 is equal to the relation $T_M/T_S$. This is the same ratio as the first clock frequency $1/T_S$ of the clock signal CL1 is related to the medium-speed second clock frequency $1/T_M$ of the clock signal CL2, i.e., equal to the first over-sampling rate N. The decimation filters 12 and 18 are by definition digital filters whose output signal is read out at a lower clock frequency than that at which its input signal is processed in the actual digital filter. This is indicated symbolically in FIG. 5 in that the decimation filters 12 and 18 are represented in it respectively by an input-function block 12a or 18a and a downstream output function block 12b or 18b. The input function blocks 12a and 18a represent the actual digital filter while the output function blocks 12b and 18b indicate the read-out process which is shown symbolically by the reading switching contacts 12c or 18c. The input function block 12a is provided with a clock input supplied by the clock signal CL1 with the high speed first clock frequency $1/T_S$ while the output function block 12b has a clock input supplied by the clock signal CL2 with a slow, i.e., medium-speed second clock frequency $1/T_M$. The input function block 18a has a clock input supplied by the clock signal CL2 with the medium-frequency second clock frequency $1/T_M$ while the output function block 18b has a clock input supplied by the clock signal CL3 with the slow third clock frequency $1/T_L$. The output function blocks 12b and 18b of the decimation filters 12 and 18 are therefore operated at a lower clock frequency $1/T_M$ or $1/T_L$ than the appertaining input function block 12a or 18a which is operated at the clock frequency $1/T_S$ or $1/T_M$, whereby the second clock frequency $1/T_M$ and the third clock frequency $1/T_L$ serve to read the output signal of the first or second decimation filter 12 or 18.

The decimation filter 12 is preferably a Sinc filter of order K and length N, i.e., its length is preferably equal to the first over-sampling rate N, i.e., equal to the ratio $T_M T_S$ of the high speed first clock frequency $1/T_S$ to the medium-speed second clock frequency $1/T_M$. For example, K=3 and N=128 apply. The decimation filter 18 is preferably a Sinc filter of first order of length W, i.e., its length is preferably equal to the second oversampling rate W, i.e., equal to the ratio $T_L/T_M$ of the medium second clock frequency $1/T_M$ to the slow third clock rate $1/T_L$.

A Sinc filter of order K and length N operated at a clock frequency $1/T_S$ is known to have a frequency dependency of:

$$F(e^{j\omega}{}_S T) = (1/N)^K (1-e^{-j\omega NT}{}_S)^K / 1-e^{-j\omega T}{}_S)^K = (1/N)^K [\sin(\omega NT_s/2)/\sin(\omega T_s/2)]^K \cdot e^{-j\omega T}{}_S{}^K (N-1)/2$$

and such a filter of the first order is preferably a mean-value generator which may consist, e.g., of an N-step shift register, whose input and whose N parallel outputs are connected each to one of N+1 inputs of a common summation element, whereby the output of the latter is connected via a dividing element with a dividing factor N to the output of the mean-value generation and thereby also to the output of the Sinc filter.

The delaying arrangement 14 consists either of a delaying element 15 operated at the first clock frequency $1/T_S$ or of a series connection 15;16 of the delaying element 15 operated at the first clock frequency $1/T_S$ and a downstream non-decimation digital filter 16 which is also operated at the first clock frequency $1/T_S$. One clock input of the delaying element 15 and one of the digital filter 16 if one is present is supplied by the clock signal CL1 with the high speed clock frequency $1/T_S$. The presence of the digital filter 16 which is only optional is indicated symbolically in FIG. 5 by its phantom image. The non-decimation digital filter 16 is preferably a Sinc filter of the first order of length four.

The high speed clocked signal $x_S[hT_S]$ is delayed by a delay period D in the delaying element 15 so that a high speed clocked delayed signal $d_S[hTs]$ appears at its output. The delay period D of the delaying element 15 is preferably equal to K(N−1)/2. If a digital filter 16 is present the high speed clocked delayed signal $d_S[hT_S]$ is furthermore converted by low-pass filtering in the digital filter 16 into a low-pass filtered delayed signal $v_S[hT_S]$. Thus, there is generated a desired signal which is of low frequency as compared with the high speed clock frequency $1/T_S$ and in which the quantization noise is suppressed in part.

The 1-bit wide signal $y_S[hT_S]$ at the high speed clock frequency $1/T_S$ is low-pass filtered in the decimation filter 12 and is decimated to the slower, medium-speed clock frequency $1/T_M=1/(N \cdot T_S)$. Low-pass filtering of the high speed clocked signal $y_S[hT_S]$ in the decimation filter 12 can also generate a desired signal which is of low frequency as compared with the high speed clock frequency $1/T_S$ and in which the quantization noise is suppressed in part. With the medium-speed clock frequency $1/T_M$, a low-pass filtered signal $y_M[kT_M]$ of much better precision than the original signal is obtained at the output of the decimation filter 12. An intelligent selection of the clock frequencies $1/T_S$ and $1/T_M$ and of the filter characteristic enables a very high degree of precision to be reached. The values of $y_M[kT_M]$ are represented by means of 16 bits for example.

The higher the selected over-sampling rate N, the stronger is the suppression of the quantization noise and the greater is also the precision of the converted signal. If the quantization error of the 1-bit analog/digital transformer 10 is considered as an idealized noise equally distributed within the interval [−Q/2, Q/2], its variance is $$\sigma_\Delta^2 = \frac{Q^2}{12} \tag{3}$$

For the linearized transmission of the quantization error the noise transmission function of the sigma-delta modulator of the second order is equal to:

$$G_{\delta\delta}(z) = (1-z^{-1})^2 \tag{4}$$

The variance of the quantization error at the output of the sigma-delta modulator 2 is:

$$\sigma_{\Delta_{si}}^2 = (T_S/2\pi) \int_{-\pi/\& T_S}^{\pi/T_S} |G_\Delta(e^{j\omega T_S})|^2 d\omega \cdot \sigma_\Delta^2$$

$$= (T_S/2\pi) \int_{-\pi/\& T_S}^{\pi/T_S} \sin^4(\omega T_S/2) \cdot d\omega \cdot \sigma_\Delta^2$$

At the output of the decimation filter 12 the signal $$y_M[kT_M] = i_M[kT_M] \Delta_M[kT_M] \tag{5}$$

appears. In case of a constant signal i[t], $i_M[kT_M]$ is equal to i[t]. In case of a low-frequency signal i[t], the decimated signal $i_M[kT_M]$ is on the other hand somewhat distorted by the low-pass characteristics of the decimation filter 12, i.e., it is subjected to a linear phase shift and is slightly damped. The transmission function of the decimation filter 12 of order K and of length N can be recursive as well as non-recursive:

$$G_N^K(z) = (1/N)^K \sum_{\substack{k_1+ \\ k_2+ \\ kN+K}} \binom{K}{k_1,k_2,\ldots,k_N} (1^{k_1} z^{-k_2} z^{-2k_3} \ldots z^{-(N-1)k_N}) \tag{6a,6b}$$

$$= (1/N)^K \left( \frac{1-z^{-N}}{1-z^{-1}} \right)^K$$

It should be noted that $z^{-1}$ is the unit delay for the high frequency $1/T_S$. For N=4, the following apply for instance:

$$G_4^1(z) = (¼)\{1+z^{-1}+z^{-2}+z^{-3}\}$$

$$G_4^2(z) = (¼)^2 \{1+2z^{-1}+3z^{-2}+4z^{-3}+3z^{-4}+2z^{-5}+z^{-6}\}$$

$$G_4^3(z) = (¼)^3 \{1+3z^{-1}+6z^{-2}+10z^{-3}+12z^{-4}+12z^{-5}+10z^{-6}+6z^{-7}+3z^{-8}+z^{-9}\} \tag{8abc}$$

The difference equations for K=1, K=2 and K=3 result respectively in:

$$y_M[kT_M] = (¼) \{y_S[kNT_S] + \tag{9a,b,c}$$

$$y_S[(kN-1)T_S] + y_S[(kN-2)T_S] + y_S[(kN-3)T_S]\}$$

$$y_M[kT_M] = (¼)^2 \{y_S[kNT_S] + 2y_S[(kN-1)T_S] + 3y_S[(kN-2)T_S] +$$

$$4y_S[(kN-3)T_S] + 3y_S[(kN-4)T_S] + 2y_S[(kN-5)T_S] + y_S[(kN-6)T_S]\}$$

$$y_M[kT_M] = (¼)^3 \{y_S[kNT_S] + 3y_S[(kN-1)T_S] + 6y_S[(kN-2)T_S] +$$

$$10y_S[(kN-3)T_S] + 12y_S[(kN-4)T_S] + 12y_S[(kN-5)T_S] +$$

$$10y_S[(kN-6)T_S] = 6y_S[(kN-7)T_S] + 3y_S[(kN-8)T_S] + y_S[(kN-9)T_S]\}$$

For the delay $\tilde{z}^{-1}$ in the slower, medium speed clock frequency $1/T_M$, it follows that $\tilde{z}^{-1} = z^{-N}$.

Three things are of interest:

1) The sum of all weights of $G_N^K(z)$ is always equal to 1, i.e., the direct current amplification is equal to 1.
2) The memory of the decimation filter 12 is dependent on its order K. Only in the case that K=1 is the memory equal to N−1, which means that in this case the memory reaches just beyond the length of a slow scanning interval. For K>1, $$N_x = K(N-1)$$

applies in general.

This means that in this case the memory is longer than the decimation rate. At the same time it can also be seen that the delay amounts to $\tau = K(N-1)/2$.

3) The weights have a special structure, i.e.,
   for K=1: rectangular
   for K=2: triangular
   for K=3: parabola shaped, with flattened center segment.

The signal $y_M[kT_M]$ at the medium-speed clock frequency has a quantization error $\Delta_M[kT_M]$ which results from the connection in series of the sigma-delta modulator 2 and the decimation filter 12 (see Barmettler et al). For interesting values of N and K the following gain $R_i$ in bits over the non-decimated case results:

For N=128, K=2→$R_i$=12.7 bits
For N=128, K=3→$R_i$=15 bits
For N=256, K=2→$R_i$=14.7 bits and
For N=256, K=3→$R_i$=17.5 bits.

This means that the statistically found error amplitudes assumed to be equally distributed are smaller at the output of the decimation filter 12 by the factor $2^{Ri}$.

$$|\Delta_M| \leq 2^{-R_i} Q/2 \quad (13)$$

Example: with N=128 and K=3

$$|\Delta_M| \leq 2^{-15} Q/2$$

The output signal of the sigma-delta modulator 1 is according to the equation (1):

$$x_S[hT_S] = u_S[hT_S] + \Delta_{Su}[hT_S]$$

In the delay element 15, the 1-bit wide signal $x_S[hT_S]$ is delayed as already mentioned earlier with the possible values {1,−1} by the delay period D to be then low-pass filtered at high frequency $1/T_S$ in the digital filter 16.

The delay of the series connection 15;16 should be adapted as much as possible to the delay caused by the decimation filter 12. A possibly short delay is an advantage from the point of view of implementation effort. The signal at the output of the delaying element 15 is:

$$d_S[hT_S] = x_S[(h-D)T_S]$$

At the output of the digital filter 16 the signal $v_S[hT_S]$ is available at the high speed clock frequency $1/T_S$ and with the possible values {+1, +½, 0, −½, 1}.

It follows that $$v_S[hT_S] = \bar{u}_S[hT_S] + \bar{\Delta}_{Su}[hT_S] \quad (14)$$

applies.

The series connection 15;16 of the delaying element 15 and of the digital filter 16 operates at the high speed clock frequency $1/T_S$. It should be noted that the digital filter 16 works as a so-called "sliding filter" and that no decimation is carried out at the slower, medium-speed clocking frequency $1/T_M$.

The series connection 15;16 applies to the desired signal similarly as in the case of the decimation filter 12. However, other distortions are present. The quantization error to be expected is not only different, but also much greater, since only one modest filtering of the quantization noise takes place.

When the digital filter 16, e.g., a "sliding" Sinc filter of the first order is of length four, the output sequence $v_{S[hTS]}$ of the digital filter 16 is very simple, although a favorable filter effect was achieved. For the transmission, the following applies:

$$v_S[hT_S] = (¼)\{d_S[hT_S] + d_S[(h-1)T_S] + d_S[(h-2)T_S] + d_S[(h-3)T_S]\} \quad (15)$$

As output values of the sequence $v_S[hT_S]$ only the 5 values {Q/2, Q/4, 0, −Q/4, −Q/2}, e.g., {+1, +½, 0, −½, −1} are possible.

For the linearized transmission of the quantization error $\bar{\Delta}_{Su[hTS]}$ to the output of the digital filter 16, the result is:

$$G_\Delta(z) = z^{-D} G_4^{-1}(z) G_\Delta(z) = (1/4) z^{-D} \left( \frac{1-z^{-4}}{1-z^{-1}} \right) (1-z^{-1})^2 \quad (17)$$

$$= (1/4)\{z^{-D} - z^{-(D+4)} - z^{-(D+4)} + z^{-(D+5)}\}$$

From this the variance of the quantization error noise $\bar{\Delta}_{Su}[hT_S]$ at the output of the digital filter 16 is calculated on basis of $$\sigma^2_{\bar{\Delta}_{Su}} = \frac{4}{16} \sigma^2_{\Delta_{Su}} = \frac{1}{4} \sigma^2_{\Delta_{Su}} = \frac{Q^2}{48} \quad (18)$$

For the bit gain, the result in this case is:

$$R_u = (1/2) \log_2 \left( \frac{\sigma^2_{\Delta_{Su}}}{\sigma^2_{\bar{\Delta}_{Su}}} \right) = (1/2) \log_2 4 = 1 \quad (19)$$

The maximum error amplitude with assumed equal distribution is thus reduced by only a factor of 2.

$$|\bar{\Delta}^{Su}| \leq 2^{-R_u} Q/2 = \frac{1}{2} Q/2 \quad (20)$$

The medium-speed signal $y_M[kT_M]$ obtained at the output of the decimation filter 12 is controlled in the summation element 13 by the high speed signal $v_S[hT_S]$ of clock frequency $1/T_S$. Since the latter can only assume the values +1, +½, 0, −½, and −1 in the selected example, only the operations "shifting", "add/subtract (+½, −½)" and "add/subtract (+1, −1)" can be carried out in the summation element 13. In the summation element 13, shifts and algebraic additions are therefore carried out with subsequent decimation to the slow clock frequency $1/T_M$. The summation element 13 has here the task to correctly control the constant signal $y_M[kT_M]$ (constant because it is sampled at a lower rate $1/T_M$) arriving from the decimation filter 12 during N high speed pulses of the frequency $1/T_S$. The process shall be explained through two examples.

a) Example 1: Multiplication of u[t] with itself, i.e., $y_S[hT_S] = x_S[hT_S]$, where N=4, K=1, D=4, and without digital filter 16, i.e., with $v_S[hT_S] = d_S[hT_S]$ Taking equation (9a) into account, the result for $y_M[kT_M]$ is:

$$y_M[kT_M] = (¼)\{y_S[kNT_S] + y_S[(kN-1)T_S] + y_S[(kN31\ 2)T_S] + y_S[(kN-3)T_S]\}$$

$$v_S[hT_S] = y_S[(h-4)T_S]$$

After N operations, the output signal of the adding element 13 is divided by N in the dividing element 17 so that the following signal $z_M[kT_M]$ appears at the latter's output:

$$z_M[kT_M] = (1/4)y_M[kT_M] \cdot \sum_{g=1}^{4} y_S[(kN+1-g)T_S]$$

$$= (1/4) \cdot y_M[kT_M] \cdot \{y_S[kT_M] +$$

$$y_S[(kN-1)T_S] + y_S[(kN-2)T_S] + y_S[(kN-3)T_S]\}$$

$$= (1/4)^2 \{y_S[kNT_S] + y_S[(kN-1)T_S] + y_S[(kN-2)T_S] +$$

$$y_S[(kN-3)T_S]\}^2$$

$$= y_M^2[kT_M]$$

This result is precisely equal to the square of $y_M[kT_M]$.

b) Example 2: Multiplication of u[t] with itself, i.e., $y_S[hT_S]$ $=x_S[hT_S]$, where N=4, K=2, D=4, and the presence of digital filter 16 which is a "sliding" Sinc filter of the first order of length four.

Taking formula (9b) into account for $y_M[kT_M]$ and formula (9a) for $v_S[hT_S]$, the result is:

$$y_M[kT_M] = (¼)^2\{y_S[kNT_S] + 2y_S[(kN-1)T_S] +$$

$$3y_S[(kN-2)T_S] + 4y_S[(kN-3)T_S] +$$

$$3y_S[(kN-4)T_S] + 2y_S[(kN-5)T_S] + y_S[(kN-6)T_S]\}$$

$$d_S[hT_S] = y_S[(h-4)T_S]$$

$$v_S[hT_S] = (¼) \{d_S[hT_S] + d_S[(h-1)T_S] + d_S[(h-2)T_S] +$$

$$d_S[(h-3)T_S]\} = (¼) \{y_S[(h-4)T_S] + y_S[(h-5)T_S] +$$

$$y_S[(h-6)T_S] + y_S[(h-7)T_S]\}$$

After N operations the output signal of the adding element 13 is again divided by N in the dividing element 17 so that the following signal $z_M[kT_M]$ appears at the output of the latter:

$$z_M[kT_M] = y_M[kT_M](1/4) \sum_{g=1}^{4} v_S[(kN+g)T_S] = (1/4)^4\{y_S[kNT_S] +$$

$$2y_S[(kN-1)T_S] + 3y_S[(kN-2)T_S] + 4y_S[(kN-3)T_S] + 3y_S[(kN-4)T_S] +$$

$$2y_S[(kN-5)T_S] + y_S[(kN-6)T_S]\} + \sum_{g=1}^{4} \sum_{p=1}^{4} y_S[(kN+1-g-p)T_S] =$$

$$(1/4)^4\{y_S[kNT_S] + 2y_S[(kN-1)T_S] + 3y_S[(kN-2)T_S] + 4y_S[(kN-3)T_S] +$$

$$3y_S[(kN-4)T_S] + 2y_S[(kN-5)T_S] + y_S[(kN-6)T_S]\} \cdot$$

$$\{y_S[kN T_S] + y_S[(kN-1)T_S] + y_S[(kN-2)T_S] + y_S[(kN-3)T_S] +$$

$$y_S[(kN-1)T_S] + y_S[(kN-2)T_S] + y_S[(kN-3)T_S] + y_S[(kN-4)T_S] +$$

$$y_S[(kN-2)T_S] + y_S[(kN-3)T_S] + y_S[(kN-4)T_S] + y_S[(kN-5)T_S] +$$

$$y_S[(kN-3)T_S] + y_S[(kN-4)T_S] + y_S[(kN-5)T_S] + y_S[(kN-6)T_S]\} =$$

$$(1/4)^4\{y_S[kNT_S] + 2y_S[(kN-1)T_S] + 3y_S[(kN-2)T_S] + 4y_S[(kN-3)T_S] +$$

$$3y_S[(kN-4)T_S] + 2y_S[(kN-5)T_S] + y_S[(kN-6)T_S]\}^2$$

It can be seen that the effect of the adding element 13 is again a squaring of the output signal $y_M[kT_M]$ of the decimation filter 12.

The output signal $z_M[kT_M]$ of the dividing element 17 is thus, if $y_S[hT_S]=x_S[hT_S]$, equal to the square of the output signal $y_M[kT_M]$ of the decimation filter 12 and thereby also, apart from the filtered-out noise spectrum, equal to the square of its input signal $y_S[hT_S]$. If $y_S[hT_S]$ and $x_S[hT_S]$ are different on the other hand, the product $x_S[hT_S] \cdot Y_S \cdot [xT_S]$ takes the place of the square $y_S[hT_S] \cdot y_S[hT_S]$ whose value, again aside from the filtered-out noise spectrum, appears as signal $z_M[kT_M]$ at the output of the dividing element 17. With low dynamic range of the signals u[t] or i[t] or f[t] the output signal of the dividing element 17 is however relatively imprecise and must be processed further by averaging $z_M[kT_M]$ in the downstream, second decimation filter 18 for at least one period of the basic frequency of the time-dependent signal u[t] or i[t] or f[t] as well as subsequent decimation to the slow clock frequency $1/T_L$. This yields the signal $z_L[jT_L]$ at the output of the second decimation filter 18 which is then equal to the sum of the squares or products appearing at the output of the dividing element 17 during that time. In the second decimation filter 18, a Sinc filtering of the first order takes place for example, with subsequent decimation to the slow clock frequency $1/T_L=1/(W \cdot T_M)$, as well as a division by W.

The time-dependent signals u[t] and i[t] are for example proportional to a 50 Hz network voltage or to a 50 Hz network current. The period of its basic frequency is then 20 ms. With strict synchronization as well as conventional direct multiplication and addition, the precision of the multiplication can hardly be improved further over several periods by averaging. In the case of the arrangement according to the invention, a greater averaging effect is achieved, so that results can be obtained that are close to those of the conventional multiplication and addition. Since the 1-bit wide data sample at the output of the sigma-delta modulator 1 or 2 does not repeat itself with absolute regularity because of the starting conditions, the error sequences at the output of the two filters 12 and 16 will also not repeat themselves precisely.

If the signal u[t] or i[t] is multiplied by itself, the square of the effective value of the signal u[t] or i[t] concerned appears at the output of the multiplication/addition element 3. If it is not the square of the effective value but the effective value itself which has to be found, the output of the multiplication/addition element 3 must be connected to an input of a square-root calculating element 19 (see FIG. 5). Following the decimation to the slow $1/T_L$ in the second decimation filter 18, the effective value $U_{eff}$ of the time-dependent signal u[t] is calculated from the output signal $z_L[jT_L]$ of the second decimation filter 18 in the square-root calculating element 19 by calculating the square root, e.g., the effective value $U_{eff}$ of the time-dependent signal u[t]. The square root calculation in the square root calculating element 19 is carried out at the slow clock frequency $1/T_L$.

Finally, the above described embodiments of the invention are intended to be illustrative only. Numerous alternative embodiments may be devised by one skilled in the art without departing from the spirit and scope of the following claims. Advantageously, the inventive circuit may be implemented on a semiconductor chip.

We claim:

1. A circuit for the summation of products of two different time-dependent signals, comprising:
   a first sigma-delta modulator, for receiving a first said time-dependent signal,
   a second sigma-delta modulator, for receiving a second said time-dependent signal,
   a delaying arrangement having no decimation, connected serially with said first sigma-delta modulator,
   a first decimation filter, connected serially with said second sigma-delta modulator,
   an adding element,
   wherein said delaying arrangement receives a first output signal from said first sigma-delta modulator and outputs a delayed first output signal to a first input of said adding element,
   wherein said first decimation filter receives a second output signal from said second sigma-delta modulator and outputs a filtered second output signal to a second input of said adding element, said first and second sigma-delta modulators, said delaying arrangement, and said first decimation filter being operated at a first clock frequency ($1/T_S$), which is greater than a second clock frequency ($1/T_M$), the latter serving to read said filtered second output signal from said first decimation filter, and wherein said adding element outputs a signal which is approximately proportional to a summation of products of said first and second time-dependent signals.

2. A circuit for the summation of products of two identical time-dependent signals, comprising:

a sigma-delta modulator, for receiving one of said two identical time-dependent signals, a delaying arrangement having no decimation, connected serially to an output of said sigma-delta modulator, a first decimation filter, connected serially to said output of said sigma-delta modulator, such that said delaying arrangement and said first decimation filter form two parallel signal paths connected together at said output of said sigma-delta modulator, an adding element, wherein said delaying arrangement receives an output signal from said sigma-delta modulator and outputs a delayed signal to a first input of said adding element, wherein said first decimation filter also receives said output signal from said sigma-delta modulator and outputs a filtered signal to a second input of said adding element, said sigma-delta modulator, said delaying arrangement, and said first decimation filter being operated at a first clock frequency ($1/T_S$), which is greater than a second clock frequency ($1/T_M$), the latter serving to read said filtered signal from said first decimation filter, and wherein said adding element outputs a signal which is approximately proportional to a summation of products of said identical time-dependent signals.

3. A circuit for the summation of products of an unknown time-dependent signal and a known time-variable function having one-bit-serial digital values, comprising:

a sigma-delta modulator, for receiving said unknown time-dependent signal, a delaying arrangement having no decimation, connected serially with said sigma-delta modulator, a first decimation filter, for receiving said known time-variable function, an adding element, wherein said delaying arrangement receives an output signal from said sigma-delta modulator and outputs a delayed signal to a first input of said adding element, wherein said first decimation filter receives said known time-variable function and outputs a filtered signal to a second input of said adding element, said sigma-delta modulator, said delaying arrangement, and said first decimation filter being operated at a first clock frequency ($1/T_S$), which is greater than a second clock frequency ($1/T_M$), the latter serving to read said filtered signal from said first decimation filter, and wherein said adding element outputs a signal which is approximately proportional to a summation of products of said unknown time-dependent signal and said known time-variable function having one-bit-serial digital values.

4. A circuit for the summation of products of an unknown time-dependent signal and a known time-variable function having multi-bit-parallel digital values, comprising:

a sigma-delta modulator, for receiving said unknown time-dependent signal, a delaying arrangement having no decimation, connected serially with said sigma-delta modulator, an adding element, wherein said delaying arrangement receives an output signal from said sigma-delta modulator and outputs a delayed signal to a first input of said adding element, wherein said adding element receives said known time-variable function at a second input of said adding element, said sigma-delta modulator and said delaying arrangement being operated at a first clock frequency ($1/T_S$), which is greater than a second clock frequency ($1/T_M$), the latter serving to read said multi-bit digital values of said known time-variable function, and wherein said adding element outputs a signal which is approximately proportional to a summation of products of said unknown time-dependent signal and said known time-variable function having multi-bit-parallel digital values.

5. A circuit as claimed in one of the claims 1–4, wherein an output of said adding element is connected in series with a dividing element and a second decimation filter, said second decimation filter being operated at said second clock frequency ($1/T_M$), which is greater than a third clock frequency ($1/T_L$), the latter serving to read an output signal of said second decimation filter.

6. A circuit as claimed in claim 2, wherein an output of said adding element is connected in series with a dividing element and a second decimation filter, said second decimation filter being operated at said second clock frequency ($1/T_M$), which is greater than a third clock frequency ($1/T_L$), the latter serving to read an output signal of said second decimation filter, and wherein an output of said series combination of said dividing element and said second decimation filter is connected to an input of a square-root calculating element.

7. A circuit as claimed in claim 5, wherein the division factor of said dividing element is equal to the ratio $T_M/T_S$, where $1/T_M$ and $1/T_S$ are said second and first clock frequencies, respectively.

8. A circuit as claimed in claim 5, wherein said second decimation filter is a Sinc filter of first order of length W, which value W is equal to the ratio $T_L/T_M$, where $1/T_M$ and $1/T_L$ are said second and third clock frequencies, respectively.

9. A circuit as claimed in one of the claims 1–3, wherein said first decimation filter is a Sinc filter of order K and length N, the latter being equal to the ratio $T_M/T_S$, whereby $1/T_M$ and $1/T_S$ are said second and first clock frequencies, respectively.

10. A circuit as claimed in one of the claims 1–4, wherein each sigma-delta modulator is a sigma-delta modulator of the second order.

11. A circuit as claimed in one of the claims 1–4, wherein said delaying arrangement comprises a delay element operated at said first clock frequency ($1/T_S$).

12. A circuit as claimed in one of the claims 1–4, wherein said delaying arrangement comprises a serial connection of a delay element operated at said first clock frequency ($1/T_S$)

and a non-decimation digital filter downstream from it, also operated at said first clock frequency ($1/T_S$).

13. A circuit as claimed in one of the claims 1–4, wherein said delaying arrangement comprises a serial connection of a delay element operated at said first clock frequency ($1/T_S$) and a non-decimation digital filter downstream from it, also operated at said first clock frequency ($1/T_S$), and wherein said non-decimation digital filter is a Sinc filter of first order of length four.

14. A circuit as claimed in one of the claims 1–4, wherein said first decimation filter is a Sinc filter of order K and length N, the latter being equal to the ratio $T_M/T_S$, where $1/T_M$ and $1/T_S$ are said second and first clock frequencies, respectively, and wherein said delaying arrangement comprises a delay element, the delay (D) of which is equal to $K(N-1)/2$.

* * * * *